(12) United States Patent  (10) Patent No.: US 7,949,308 B2
Tingleff  (45) Date of Patent: May 24, 2011

(54) TUNEABLE FILTER

(75) Inventor: Jens Tingleff, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 12/539,979

(22) Filed: Aug. 12, 2009

(65) Prior Publication Data

US 2010/0261436 A1 Oct. 14, 2010

(30) Foreign Application Priority Data

Aug. 21, 2008 (GB) .................................. 0815285.2

(51) Int. Cl.
    *H04B 1/40* (2006.01)
(52) U.S. Cl. ........................ 455/77; 455/192.1; 455/307
(58) Field of Classification Search .................... 455/77, 455/118, 296, 313, 323, 550.1
    See application file for complete search history.

(56) References Cited

U.S. PATENT DOCUMENTS

| 5,023,941 | A | 6/1991 | Trumpff et al. |
| 5,267,234 | A | 11/1993 | Harrison |
| 5,640,686 | A | 6/1997 | Norimatsu |
| 6,035,213 | A | 3/2000 | Tokuda et al. |
| 7,092,043 | B2 * | 8/2006 | Vorenkamp et al. .......... 348/726 |
| 7,116,958 | B1 | 10/2006 | Brown et al. |
| 7,181,184 | B1 | 2/2007 | Dimeo et al. |
| 7,580,683 | B2 * | 8/2009 | Gardenfors et al. ............ 455/73 |
| 2002/0153942 | A1 | 10/2002 | Burkhard |
| 2003/0008617 | A1 | 1/2003 | Tamaru et al. |
| 2003/0016771 | A1 | 1/2003 | Nuutinen |
| 2005/0064839 | A1 | 3/2005 | Smith et al. |
| 2005/0130700 | A1 | 6/2005 | Gardenfors et al. |
| 2007/0076813 | A1 | 4/2007 | Haartsen |
| 2007/0153878 | A1 | 7/2007 | Filipovic |
| 2008/0238569 | A1 | 10/2008 | Matsuo |
| 2009/0310712 | A1 * | 12/2009 | Nakatani ....................... 375/316 |

FOREIGN PATENT DOCUMENTS

| EP | 1675263 A1 | 6/2006 |
| GB | 461330 A | 2/1937 |
| JP | 2003224483 A | 8/2003 |
| WO | 01/89079 A3 | 11/2001 |
| WO | 2007083107 A | 7/2007 |

* cited by examiner

*Primary Examiner* — Tuan H Nguyen
(74) *Attorney, Agent, or Firm* — Novak Druce DeLuca + Quigg LLP

(57) ABSTRACT

A radio receiver comprising: a frequency shifter for receiving a radio frequency signal including a wanted signal in a first frequency band and an interferer in a second frequency band overlapping the first frequency band, and for frequency shifting the radio frequency signal to form a frequency shifted signal, in which the first frequency band is shifted to a third frequency band below radio frequency and the second frequency band is shifted to a fourth frequency band; and a filter for receiving the frequency shifted signal and for attenuating the fourth frequency band relative to the parts of the third frequency band that do not include the fourth frequency band, wherein the filter is dynamically tuneable.

20 Claims, 4 Drawing Sheets

TUNEABLE FILTER

FIELD OF THE INVENTION

This invention relates to tuning filters, for example to attenuate interfering signals. The present invention is particularly applicable for attenuating interfering signals in receivers and transceivers.

BACKGROUND OF THE INVENTION

Transceivers are often arranged to transmit and receive signals simultaneously. The transmitter and receiver of a transceiver arranged in such a manner generally operate at different frequencies, but in many circumstances it is desirable that those frequencies are as close together as possible. A problem with such transceivers is that the transmitted signal leaks into the receiver whilst the receiver is attempting to receive another signal.

EP441500, the system of which is shown schematically in FIG. 1, describes a system designed to address this problem. A transmitter 1 and receiver 2 are coupled to a common antenna 3 via an antenna duplex filter 4 comprising two bandpass filters 5, 6 connected respectively to the transmitter and the receiver. The receiver comprises an amplifier 7 connected to a notch filter 8 which is connected to the remainder of the receiver 9. The notch filter attenuates signals in a specific frequency range to low levels. This range is chosen to centre on the transmit frequency.

A further problem associated with radio receivers is that of insertion loss. Insertion loss is the decrease in transmitted signal power resulting from the insertion of a device in a transmission line. EP441500 teaches that the insertion loss is less critical if the notch filter 8 is positioned directly at the output of the amplifier 7 so that the amplified signals can be directly filtered. However, when receiving a signal onto which the leaked transmitted signal is superimposed, the notch filter of EP441500 must cope with a dynamic range of signal amplitude. This is because the leaked transmitted signal usually has a much larger signal amplitude than the received signal since it is generated in the transceiver whereas the received signal is generated external to the transceiver and has suffered considerable attenuation by the time it reaches the receiver. Filters designed to cope with such dynamic signal amplitude are undesirable because they are bulky and expensive.

There is thus a need for an improved receiver design which is smaller and cheaper to make, whilst having the advantages of accurately isolating a wanted signal from an interfering signal and protecting received signals from insertion loss.

SUMMARY OF THE INVENTION

According to a first aspect of the present invention there is provided a radio receiver comprising: a frequency shifter configured to receive a radio frequency signal including a wanted signal in a first frequency band and an interferer in a second frequency band overlapping the first frequency band, and configured to frequency shift the radio frequency signal to form a frequency shifted signal, in which the first frequency band is shifted to a third frequency band below radio frequency and the second frequency band is shifted to a fourth frequency band; and a filter configured to receive the frequency shifted signal and to attenuate the fourth frequency band relative to the parts of the third frequency band that do not include the fourth frequency band, wherein the filter is dynamically tuneable.

Preferably the filter comprises a series-resonant impedance to ground and a resonant frequency of the filter lies within the fourth frequency band.

The filter may comprise a variable capacitor and a variable inductor, the variable capacitor and variable inductor being controllable by a common control source.

The filter may comprise a fixed capacitor and a circuit equivalent to a time-varying inductor. The circuit equivalent to a time-varying inductor may comprise two variable voltage controlled current sources controllable by a common control source. This filter may suitably be a transconductance capacitor filter.

The filter may suitably be a tuneable poly-phase band-stop filter. Such a filter may implement tuneable cross-coupling.

The interferer may be a frequency hopping signal. The wanted signal may also be a frequency hopping signal.

Suitably the third frequency band is an intermediate frequency band. Alternatively the third frequency band may be a baseband frequency band.

Preferably, the radio receiver may further comprise a second filter which receives signals outputted from the first filter, the second filter being configured to only output signals with frequencies substantially equal to the third frequency band.

The first filter may suitably be a passive filter and the second filter may be an active filter.

Suitably, the radio receiver further comprises an amplifier for receiving the radio frequency signal, wherein an output of the amplifier is connected to an input of the frequency shifter.

According to a second aspect of the present invention there is provided a transceiver comprising the radio receiver and further comprising a transmitter wherein the interferer forms part of a signal transmitted by the transmitter, wherein the wanted signal comprises a first carrier frequency component and the interferer comprises a second carrier frequency component, wherein the filter is dynamically tuneable in dependence on the frequency difference between the first carrier frequency component and the second carrier frequency component.

Preferably, the receiver and transmitter are controllable by a common control source.

Preferably, the common control source is configured to control the frequency shifter to frequency shift the radio frequency signal to form the frequency shifted signal, and is further configured to control the filter to attenuate the fourth frequency band relative to the parts of the third frequency band that do not include the fourth frequency band, in dependence on the frequency difference between the first carrier frequency component and the second carrier frequency component, the frequency difference being known by the common control source prior to the receiver receiving the radio frequency signal.

According to a third aspect of the present invention there is provided a method for processing signals in a radio receiver, comprising: receiving at a frequency shifter a radio frequency signal including a wanted signal in a first frequency band and an interferer in a second frequency band overlapping the first frequency band; frequency shifting the radio frequency signal at the frequency shifter to form a frequency shifted signal, in which the first frequency band is shifted to a third frequency band below radio frequency and the second frequency band is shifted to a fourth frequency band; receiving the frequency shifted signal at a filter; and attenuating the fourth frequency band at the filter relative to the parts of the third frequency band that do not include the fourth frequency band, wherein the filter is dynamically tuneable.

BRIEF DESCRIPTION OF THE DRAWINGS

The present invention will now be described by way of example with reference to the accompanying drawings. In the drawings.

DETAILED DESCRIPTION OF THE INVENTION

Figure 1:
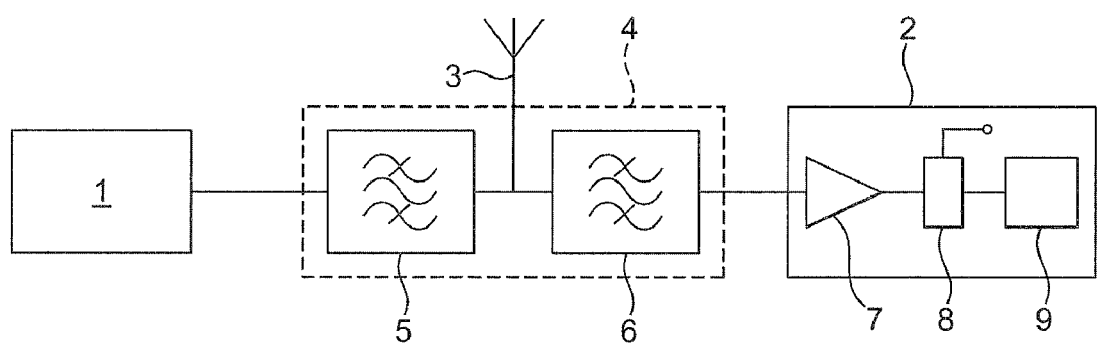
FIG. 1 is a schematic diagram of a radio transceiver.
Figure 2:
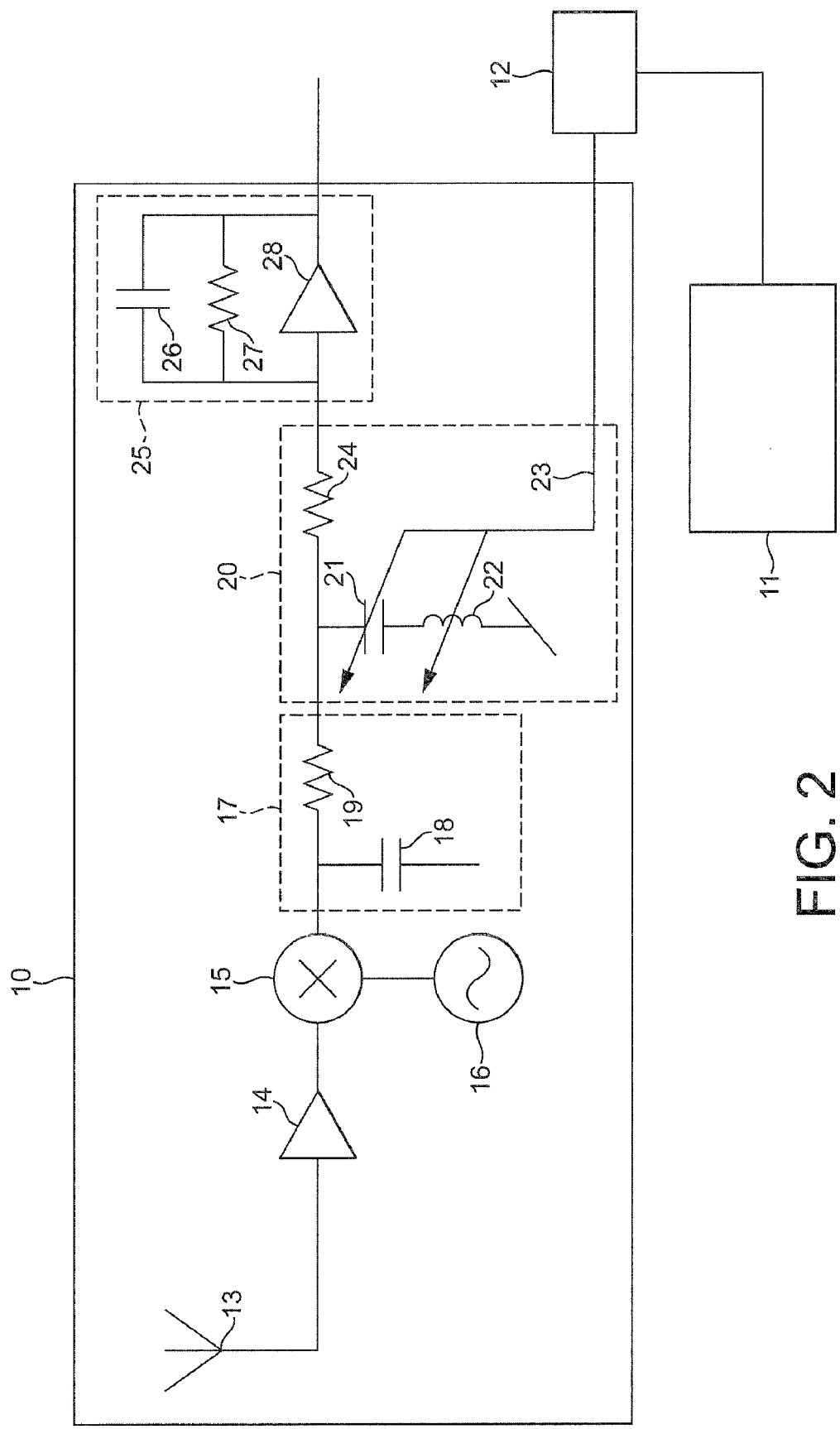
FIG. 2 is a schematic diagram of a radio transceiver comprising a tuneable filter.

FIG. 2 shows a schematic diagram of the general arrangement of a receiver according to one embodiment of the present invention. The receiver may be implemented as part of a radio transceiver as shown in the figure.

The radio receiver receives a radio frequency signal including a wanted signal in a first frequency band and an interferer in a second frequency band, where the second frequency band overlaps the first frequency band. A tuneable filter is used to isolate the wanted signal by attenuating the frequency of the interferer relative to the frequency of the wanted signal. The tuneable filter is located after a frequency mixer in the receive chain. The frequency mixer is used to shift the received signal to a frequency lower than radio frequency. There are a number of advantages associated with locating the tuneable filter after the frequency mixer. For example, the filter has a quality factor that is higher than if it were operating at radio frequency. This has the effect that the smallest practical frequency difference that can be detected between the carrier frequency of the wanted signal and a frequency of the interferer is smaller, or alternatively that the sensitivity of the filter is higher, than if the filter was located in part of the receive chain that processed radio frequency signals.

The transceiver comprises a receiver 10 coupled to a transmitter 11. The receiver 10 and transmitter 11 are controlled by the same control source 12. The receiver comprises an antenna 13. The output of the antenna 13 is connected to the input of an amplifier 14. Amplifier 14 is suitably a low noise amplifier. The amplifier amplifies the radio frequency signals received by the antenna. The output of the amplifier 14 is connected to the input of a frequency mixer 15. An oscillator 16 is connected to a further input of the frequency mixer 15. The frequency mixer downshifts the signals outputted from the amplifier 14 by mixing them with a signal generated by the oscillator 16.

The frequency mixer receives a radio frequency signal including a wanted signal in a first frequency band and an interferer in a second frequency band. The second frequency band overlaps the first frequency band. If the receiver forms part of a transceiver that simultaneously transmits and receives signals, the interferer may be a signal transmitted from the transmitter that has leaked into the receiver. The receiver may have received the transmitted signal through the receiver antenna 13 or the transmitted signal may have leaked into the receiver by other means, for example through circuitry internal to the transceiver. Alternatively, the interferer may have been generated external to the transceiver. The frequency of the interferer is often known in advance of its reception by the transceiver, for example in multi-standard radio transceivers. In any event, the interferer may be a frequency hopping signal. The wanted signal may also be a frequency hopping signal. A frequency hopping signal is a signal which occupies a frequency band that varies over time according to a predetermined hopping sequence.

The wanted signal comprises a carrier frequency component that has a known frequency or that varies in frequency with a known hopping sequence. The wanted signal may further comprise a modulated component. The frequency mixer 15 is configured to shift the frequency of the radio frequency signal outputted from the amplifier 14 such that the carrier frequency of the wanted signal shifts down to a known further frequency. The known further frequency is a frequency at which the remaining components in the receiver chain preferably operate. This known further frequency is lower than radio frequency, for example lower than 3 kHz, and may be an intermediate frequency or a baseband frequency. The frequency mixer 15 applies an equal downshift to all components of the signal outputted from the amplifier 14. The interferer will therefore be frequency shifted by the same amount as the wanted signal. The frequency shifted signal will include a shifted wanted signal in a third frequency band and a shifted interferer in a fourth frequency band. The following frequency relationships apply:

$$Fsw = Fw(t) - x(t)$$

$$Fsu(t) = Fu(t) - x(t) = Fu(t) - Fw(t) + Fsw = \Delta F(t) + Fsw$$

where Fsw is the frequency of the carrier frequency of the shifted wanted signal, Fw is the frequency of the wanted signal, x is the frequency shift applied by the frequency mixer, Fsu is a frequency of the shifted interferer, Fu is a frequency of the interferer and (t) denotes those terms which are a function of time.

The output of the frequency mixer 15 is connected to the input of a bandpass filter 17. The bandpass filter 17 attenuates all frequencies except those in a range around the centre frequency of the filter. The centre frequency is suitably chosen to be the carrier frequency of the shifted wanted signal. In one embodiment the bandpass filter 17 comprises a capacitor 18 and a resistor 19. The capacitor 18 is connected to the input of the bandpass filter 17 and a peripheral circuit (not shown). The resistor 19 is connected to both the input of the bandpass filter and the output of the bandpass filter. The output of the bandpass filter comprises the frequency shifted signal including both the shifted wanted signal and the shifted interferer, since the frequency bands of both these components of the frequency shifted signal are within the centre frequency range of the filter.

The output of the bandpass filter 17 is connected to the input of a tuneable filter 20. Tuneable filter 20 performs frequency agile filtering. It may be a passive filter. Tuneable filter 20 attenuates signals with frequencies in a range around the centre frequency of the filter. The centre frequency of tuneable filter 20 is tuned to correspond to the frequency of the shifted interferer. In one embodiment, tuneable filter 20 comprises a series-resonant impedance to ground. In this embodiment, the tuneable filter 20 is dynamically tuned whilst the receiver is receiving signals such that its resonant frequency matches the frequency of the shifted interferer. At resonance, tuneable filter 20 attenuates the shifted interferer relative to the rest of the frequency shifted signal that does not include the frequency band of the shifted interferer. The term 'dynamically tuned' is used here to mean that the filter is tuned during the time in which the signals are received by the receiver.

FIG. 2 shows example circuitry of tuneable filter 20 comprising a series-resonant impedance to ground. Tuneable filter 20 is shown to comprise a variable capacitor 21, a variable inductor 22 and a resistor 24. The input of the tuneable filter 20 is connected to the variable capacitor 21. The variable capacitor 21 is connected in series to the variable inductor 22. The variable inductor 22 is further connected to ground. The variable capacitor 21 and the variable inductor 22 are controlled by a common control source 12 on the same control line 23. The resistor 24 is connected to both the input of the tuneable filter 20 and the output of the tuneable filter 20.

Tuneable filter 20 receives at its input the frequency shifted signal from the bandpass filter 17. Tuneable filter 20 can be used to attenuate the shifted interferer if an instantaneous frequency of the shifted interferer is known. In an embodiment where the receiver forms part of a transceiver and the interferer is a signal transmitted by the transmitter of the transceiver, the shifted interferer comprises a carrier frequency component. If the interferer is a frequency hopping signal, the carrier frequency component periodically changes frequency. The frequency hopping sequence of the carrier frequency component is known to the transceiver. If the wanted signal is a frequency hopping signal, its frequency hopping sequence is also known to the transceiver. The transmitter and receiver of the transceiver are controlled by a common control source 12. The common control source 12 uses knowledge of the shifted wanted signal carrier frequency and the instantaneous frequency difference between the carrier frequency component of the wanted signal and the carrier frequency component of the interferer, to control the operation of tuneable filter 20 via control line 23. The tuneable filter 20 is thus dynamically tuned such that its resonant centre frequency matches the carrier frequency of the shifted interferer. The frequency band of the shifted interferer substantially coincides with the centre frequency range of the filter such that the shifted interferer is attenuated relative to the parts of the shifted wanted signal that do not include the frequency band of the shifted interferer.

In the example circuitry of tuneable filter 20 shown in FIG. 2, control line 23 varies the capacitance of the variable capacitor 21 and/or the inductance of the variable inductor 22 such that the resonant frequency of the tuneable filter matches the carrier frequency of the shifted interferer. The resonant frequency of the tuneable filter 20 is given by:

$$Fr(t)=1/(2\pi\sqrt{C(t)L(t)})$$

where Fr is the resonant frequency of the tuneable filter 20, C is the capacitance of the variable capacitor 21, L is the inductance of the variable inductor 22 and (t) denotes those terms which are a function of time.

Since the resonant frequency matches the frequency of the shifted interferer, it follows that:

$$Fr(t)=\Delta F(t)+Fsw$$

In other words, the tuneable filter 20 is dynamically tuned in dependence on changes in the frequency difference, $\Delta F(t)$.

The output of tuneable filter 20 is connected to the input of a selectivity filter 25. The selectivity filter 25 selects a frequency channel for further processing. Any suitable selectivity filter may be used. FIG. 2 shows example circuitry of active selectivity filter 25. Each of a capacitor 26, a resistor 27 and an amplifier 28 are connected to both the input and output of the selectivity filter 25. The capacitor 26, resistor 27 and amplifier 28 are themselves connected in parallel. The selectivity filter may be a fixed filter.

Figure 3:
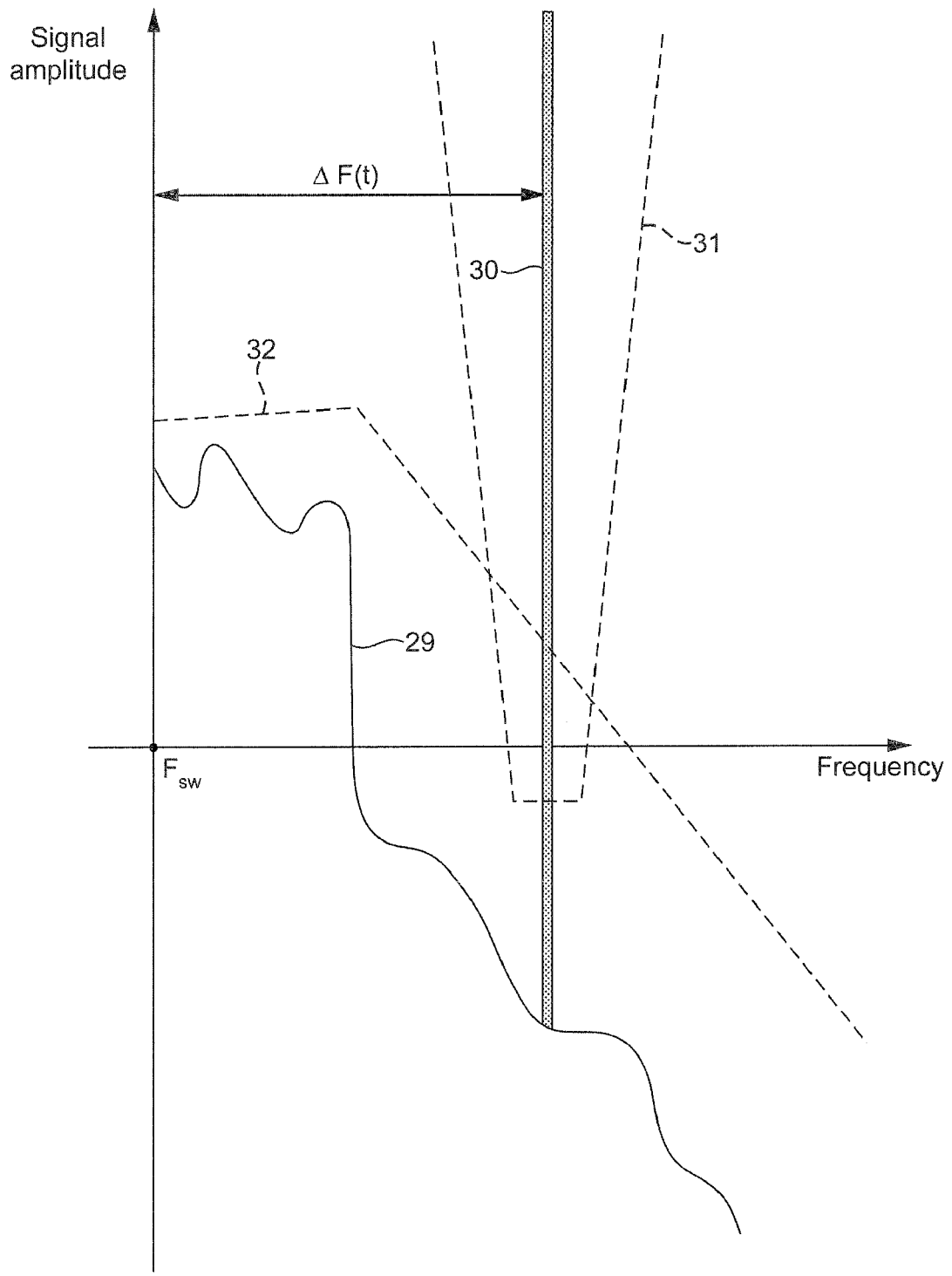
FIG. 3 illustrates the frequency response of the tuneable filter and the selectivity filter in the radio transceiver of FIG. 2.

FIG. 3 illustrates the frequency response of the tuneable filter 20 and the selectivity filter 25 at a single point in time. The x-axis denotes frequency and the y-axis signal amplitude. The origin of the plot is at the carrier frequency of the shifted wanted signal, Fsw. The shifted wanted signal is denoted by solid line 29. The strong shifted interferer (or carrier frequency of the shifted interferer) is denoted by solid line 30. The frequency difference between Fsw and the shifted interferer is marked as $\Delta F(t)$. The shifted wanted signal and the shifted interferer can be seen to overlap at the frequency of the shifted interferer. At this frequency, the shifted interferer has a far larger signal amplitude than the shifted wanted signal. The dotted line 31 denotes the response of the tuneable filter 20. Any signal within the stop band shown by the dotted line is strongly attenuated by the filter. This response 31 is centred on the frequency of the shifted interferer and extends to frequencies in a range around the frequency of the shifted interferer. It can be seen that the shifted interferer 30 is attenuated relative to the shifted wanted signal 29. The shifted interferer 30 is substantially removed by the tuneable filter response 31. The dotted line 32 denotes the response of the selectivity filter 25. Any signal below the dotted line 32 is selected and outputted by the selectivity filter 25. The response 32 substantially follows the line 29 of the shifted wanted signal, but is displaced to a slightly higher signal amplitude than the shifted wanted signal 29 at any given frequency.

Figure 4:
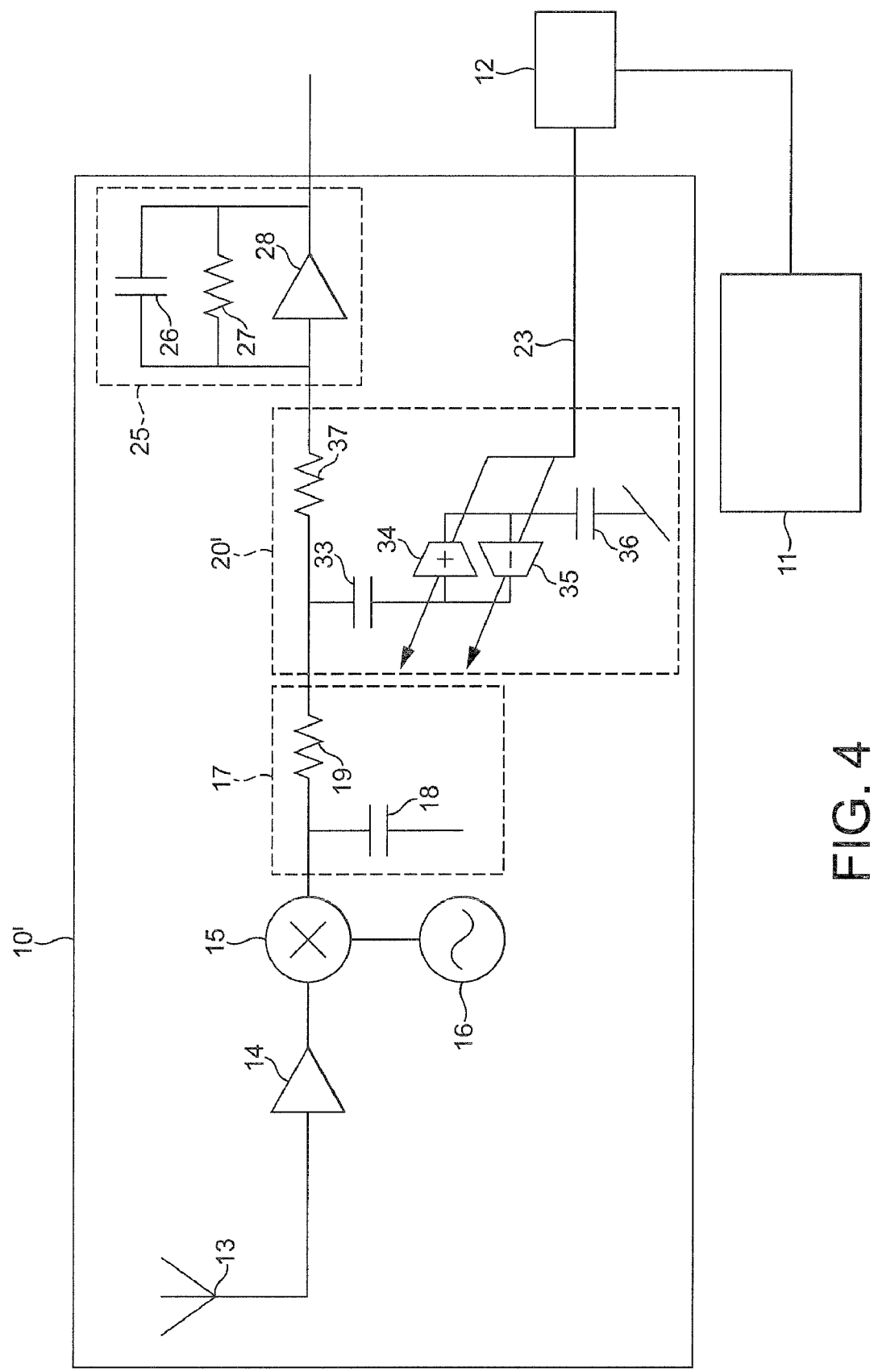
FIG. 4 is a schematic diagram of a radio transceiver comprising an alternative tuneable filter.

FIG. 4 is a schematic diagram of a receiver comprising a tuneable filter 20' with alternative example circuitry. Tuneable filter 20' comprises a series-resonant impedance to ground consisting of a fixed capacitor 33 connected in series to ground through a circuit equivalent to a time-varying inductor. The input of the tuneable filter 20' is connected to a fixed capacitor 33. Two voltage controlled current sources 34, 35 are connected in parallel. The voltage controlled current sources 34, 35 are connected at one end to the capacitor 33 and at the other end to a fixed capacitor 36. The fixed capacitor 36 is further connected to ground. The voltage controlled current sources 34, 35 are controlled by a common control source 12 on the same control line 23. A resistor 37 is connected to both the input of the tuneable filter 20' and the output of the tuneable filter 20'. This type of filter is commonly known as a Gm-C filter or a transconductance capacitance filter.

In the example circuitry of tuneable filter 20' shown in FIG. 4, control line 23 varies the effective inductance of the circuit equivalent to a time-varying inductor such that the resonant frequency of the tuneable filter matches the carrier frequency of the shifted interferer. The resonant frequency of the tuneable filter 20' is given by:

$$Fr'(t)=1/(2\pi\sqrt{C'(t)L'(t)})$$

where:

$$C'(t)=C_1$$

$$L'(t)=C_2/gm^2(t)$$

where $C_1$ is the capacitance of the fixed capacitor 33, $C_2$ is the capacitance of the fixed capacitor 36, $gm^2$ is the transconductance of the voltage controlled current sources and (t) denotes those terms which are a function of time.

Since the resonant frequency matches the frequency of the shifted interferer, it follows that:

$$Fr'(t)=\Delta F(t)+Fsw$$

It other words, as with the example circuitry of FIG. 2, the tuneable filter 20' of FIG. 4 is dynamically tuned in dependence on changes in the frequency difference, $\Delta F(t)$.

The present invention uses knowledge of the frequency difference between a wanted signal and an interferer in a receiver for precise removal of the interferer. This is achieved by use of a tuneable filter that is dynamically tuned in dependence on the frequency difference to attenuate the interferer.

When a receiver uses a tuneable filter as described in the present invention, the interferer can be removed using a minimal width filter. This is advantageous because it reduces the power and area consumption associated with the filter.

If the interferer has a much larger signal amplitude than the wanted signal, it is advantageous to remove the interferer before it reaches elements of the receiver that are only capable of functioning normally when processing signals of limited dynamic range.

Prior removal of the interferer at the tuneable filter reduces the signal amplitude inputted to the selectivity filter. This reduces the power and area consumed by the selectivity filter.

It is standard practice in the art to reduce the number of components in a receiver to reduce insertion loss. The present invention deviates from this principle by inserting a frequency mixer prior to the tuneable filter. However, the inventors have found the insertion loss associated with this extra component to be outweighed by the advantages associated with the tuneable filter operating at frequencies below radio frequency.

Employing a filter to block an unwanted interfering signal in the part of the receiver that processes signals at radio frequency is problematic for a number of reasons. Firstly, in an integrated circuit with minimal external components, the area associated with an inductor is large and thus undesirable. Secondly, circuits operating at radio frequency have a finite quality factor that is lower than the quality factor of circuits operating at frequencies below radio frequency. This has the effect that the smallest practical frequency difference that can be detected is lower, or the sensitivity of the circuit is higher, for circuits operating at frequencies below radio frequency than for circuits operating at radio frequency.

Some embodiments of the present invention implement time-varying filtering at frequencies below radio frequency by down-shifting the signal frequencies at a frequency mixer before they enter the tuneable filter. The frequency mixer may down-shift the radio frequency signals to intermediate or base-band frequency signals. An advantage of realising the time-varying filtering at intermediate or base-band frequencies is that alternative implementations of time-varying filters can be used, for example the transconductance capacitance filter shown in FIG. 4. An advantage of using the transconductance capacitance filter is that the bandwidth used to remove the interferer can be reduced relative to the bandwidth of the tuneable filter shown in FIG. 2. This reduces the practical frequency difference that can be detected, which has two associated advantages. Firstly, the performance of the transceiver is increased by reducing the effect of the interferer on the reception and isolation of the wanted signal. Secondly, the ability to detect smaller frequency differences increases the amount of the frequency spectrum available for simultaneous use by the transmitter and receiver of the transceiver. The performance of the complete system is thereby increased.

The present invention could be suitably implemented in a system which desires to receive a wide-band signal (for example WiFi 802.11g OFDM (Orthogonal Frequency Division multiplexing) or CCK (Complementary Code Keying) modulated signal) at a fixed frequency, whilst rejecting a leaked transmitted signal from a Bluetooth narrow-band frequency hopping signal emitted by a transmitter in the same system.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention. For example, the present invention could be used to block multiple interfering signals. If these signals have different frequencies, a tuneable filter that attenuates different frequencies could be employed. An example of such a filter is a poly-phase band-stop filter made frequency agile using tuneable cross-coupling. Furthermore, it will be immediately apparent to a person skilled in the art that gain variation and frequency removal can be performed independently in the tuneable filter without changing the nature of the present invention.

The invention claimed is:

1. A multi-standard transceiver, comprising:
 a radio receiver including:
  a frequency shifter configured to receive a radio frequency signal at a radio frequency including a wanted signal in a first frequency band and an interferer in a second frequency band overlapping the first frequency band, and configured to frequency shift the radio frequency signal to form a frequency shifted signal, in which the first frequency band is shifted to a third frequency band below the radio frequency of the radio frequency signal and the second frequency band is shifted to a fourth frequency band; and
  a first filter configured to receive the frequency shifted signal and to attenuate the fourth frequency band relative to portions of the third frequency band that do not include the fourth frequency band, wherein the first filter is dynamically tuneable;
 the multi-standard transceiver further including
  a transmitter configured to transmit a signal comprising the interferer; and
  a common control source configured to control the receiver and transmitter, the common control source configured to tune the first filter in dependence on an instantaneous frequency difference between the wanted signal and the interferer, such that the fourth frequency band matches a center frequency of the first filter.

2. A transceiver as claimed in claim 1, wherein the first filter comprises a series-resonant impedance to ground, a resonant frequency of the first filter lying within the fourth frequency band.

3. A transceiver as claimed in claim 1, wherein the first filter comprises a variable capacitor and a variable inductor, the variable capacitor and variable inductor being controllable by a common control source.

4. A transceiver as claimed in claim 1, wherein the first filter comprises a fixed capacitor and a circuit equivalent to a time-varying inductor.

5. A transceiver as claimed in claim 4, wherein the circuit equivalent to a time-varying inductor comprises two variable voltage controlled current sources controllable by a common control source.

6. A transceiver as claimed in claim 4, wherein the first filter is a transconductance capacitor filter.

7. A transceiver as claimed in claim 1, wherein the first filter is a tuneable poly-phase band-stop filter.

8. A transceiver as claimed in claim 7, wherein the poly-phase band-stop filter implements tuneable cross-coupling.

9. A transceiver as claimed in claim 1, wherein the interferer is a frequency hopping signal.

10. A transceiver as claimed in claim 1, wherein the wanted signal is a frequency hopping signal.

11. A transceiver as claimed in claim 1, wherein the third frequency band is an intermediate frequency band.

12. A transceiver as claimed in claim 1, wherein the third frequency band is a baseband frequency band.

13. A transceiver as claimed in claim 1, wherein the radio receiver further comprises a second filter which receives signals outputted from the first filter, the second filter being configured to only output signals with frequencies substantially equal to the third frequency band.

14. A transceiver as claimed in claim 1, wherein the first filter is a passive filter.

15. A transceiver as claimed in claim 13, wherein the second filter is an active filter.

16. A transceiver as claimed in claim 1, wherein the radio receiver further comprises an amplifier for receiving the radio frequency signal, wherein an output of the amplifier is connected to an input of the frequency shifter.

17. A multi-standard transceiver comprising:
   a radio receiver including:
      a frequency shifter configured to receive a radio frequency signal at a radio frequency including a wanted signal in a first frequency band and an interferer in a second frequency band overlapping the first frequency band, and configured to frequency shift the radio frequency signal to form a frequency shifted signal, in which the first frequency band is shifted to a third frequency band below the radio frequency of the radio frequency signal and the second frequency band is shifted to a fourth frequency band; and
      a filter configured to receive the frequency shifted signal and to attenuate the fourth frequency band relative to portions of the third frequency band that do not include the fourth frequency band, wherein the filter is dynamically tuneable; and
   a transmitter, wherein the interferer forms part of a signal transmitted by the transmitter;
   wherein the wanted signal comprises a first carrier frequency component and the interferer comprises a second carrier frequency component, wherein the filter is dynamically tuneable in dependence on a frequency difference between the first carrier frequency component and the second carrier frequency component.

18. A transceiver as claimed in claim 17, wherein the receiver and transmitter are controlled by a common control source.

19. A transceiver as claimed in claim 18, wherein the common control source is configured to control the frequency shifter to frequency shift the radio frequency signal to form the frequency shifted signal, and is further configured to control the filter to attenuate the fourth frequency band relative to portions of the third frequency band that do not include the fourth frequency band, in dependence on a frequency difference between the first carrier frequency component and the second carrier frequency component, the frequency difference being known by the common control source prior to the receiver receiving the radio frequency signal.

20. A method for processing signals in a multi-standard transceiver comprising a radio receiver, a transmitter, and a common control source configured to control the receiver and transmitter, the method comprising:
   receiving at a frequency shifter of the receiver a radio frequency signal at a radio frequency including a wanted signal in a first frequency band and an interferer in a second frequency band overlapping the first frequency band, the interferer being part of a signal transmitted by the transmitter;
   frequency shifting the radio frequency signal at the frequency shifter to form a frequency shifted signal, in which the first frequency band is shifted to a third frequency band below the radio frequency of the radio frequency signal and the second frequency band is shifted to a fourth frequency band;
   at the common control source, tuning a filter in dependence on an instantaneous frequency difference between the wanted signal and the interferer such that the fourth frequency band matches a center frequency of the filter;
   receiving the frequency shifted signal at the filter; and
   attenuating the fourth frequency band at the filter relative to portions of the third frequency band that do not include the fourth frequency band.

* * * * *